United States Patent
Furuya et al.

(10) Patent No.: US 12,031,213 B2
(45) Date of Patent: Jul. 9, 2024

(54) LAMINATE

(71) Applicant: SHOWA DENKO K.K., Tokyo (JP)

(72) Inventors: Akira Furuya, Tokyo (JP); Tadaaki Kojima, Tokyo (JP); Hiroshi Suzuki, Tokyo (JP); Fumiaki Naka, Tokyo (JP)

(73) Assignee: Resonac Corporation, Tokyo (JP)

( * ) Notice: Subject to any disclaimer, the term of this patent is extended or adjusted under 35 U.S.C. 154(b) by 91 days.

(21) Appl. No.: 17/595,570

(22) PCT Filed: Jul. 9, 2020

(86) PCT No.: PCT/JP2020/026840
§ 371 (c)(1),
(2) Date: Nov. 19, 2021

(87) PCT Pub. No.: WO2021/020064
PCT Pub. Date: Feb. 4, 2021

(65) Prior Publication Data
US 2022/0235468 A1    Jul. 28, 2022

(30) Foreign Application Priority Data

Jul. 31, 2019    (JP) ................................ 2019-141027

(51) Int. Cl.
*B32B 15/01*    (2006.01)
*B32B 3/10*    (2006.01)
(Continued)

(52) U.S. Cl.
CPC .............. *C23C 28/322* (2013.01); *B32B 3/10* (2013.01); *B32B 3/266* (2013.01); *B32B 3/30* (2013.01);
(Continued)

(58) Field of Classification Search
CPC ......... C23C 16/4404; C23C 8/12; C23C 8/14; C23C 18/34; C23C 18/36; C23C 18/42;
(Continued)

(56) References Cited

U.S. PATENT DOCUMENTS 6,280,597 B1    8/2001    Kashiwada et al.
6,534,117 B1    3/2003    Yoshio et al.
(Continued)

FOREIGN PATENT DOCUMENTS

CN    1609273 A    4/2005
CN    1842616 A    10/2006
(Continued)

OTHER PUBLICATIONS

Communication dated Mar. 9, 2021, issued by the Taiwanese Patent Office in application No. 109124385.
(Continued)

*Primary Examiner* — Michael E. La Villa
(74) *Attorney, Agent, or Firm* — Sughrue Mion, PLLC

(57) ABSTRACT

A laminate including a metallic base material, a nickel-containing plating film layer formed on the metallic base material, and a gold plating film layer formed on the nickel-containing plating film layer, in which pinholes in the gold plating film layer are sealed with a passive film having a thickness of 15 nm or greater. Also disclosed is a constituent member of a semiconductor production device including the laminate and a method for producing the laminate.

6 Claims, 1 Drawing Sheet

(51) Int. Cl.
| | |
|---|---|
| *B32B 3/26* | (2006.01) |
| *B32B 3/30* | (2006.01) |
| *B32B 15/04* | (2006.01) |
| *B32B 15/18* | (2006.01) |
| *B32B 15/20* | (2006.01) |
| *C23C 8/12* | (2006.01) |
| *C23C 8/14* | (2006.01) |
| *C23C 18/16* | (2006.01) |
| *C23C 18/18* | (2006.01) |
| *C23C 18/32* | (2006.01) |
| *C23C 18/34* | (2006.01) |
| *C23C 18/36* | (2006.01) |
| *C23C 18/42* | (2006.01) |
| *C23C 18/44* | (2006.01) |
| *C23C 18/52* | (2006.01) |
| *C23C 18/54* | (2006.01) |
| *C23C 28/00* | (2006.01) |
| *C23C 28/02* | (2006.01) |
| *C23C 30/00* | (2006.01) |
| *C25D 3/12* | (2006.01) |
| *H01J 37/32* | (2006.01) |
| *C22C 38/44* | (2006.01) |
| *C23C 16/44* | (2006.01) |

(52) U.S. Cl.
CPC ............ *B32B 15/01* (2013.01); *B32B 15/015* (2013.01); *B32B 15/017* (2013.01); *B32B 15/018* (2013.01); *B32B 15/04* (2013.01); *B32B 15/043* (2013.01); *B32B 15/18* (2013.01); *B32B 15/20* (2013.01); *C23C 8/12* (2013.01); *C23C 8/14* (2013.01); *C23C 18/1637* (2013.01); *C23C 18/1651* (2013.01); *C23C 18/1653* (2013.01); *C23C 18/1689* (2013.01); *C23C 18/1696* (2013.01); *C23C 18/1848* (2013.01); *C23C 18/32* (2013.01); *C23C 18/34* (2013.01); *C23C 18/36* (2013.01); *C23C 18/42* (2013.01); *C23C 18/44* (2013.01); *C23C 18/52* (2013.01); *C23C 18/54* (2013.01); *C23C 28/02* (2013.01); *C23C 28/021* (2013.01); *C23C 28/023* (2013.01); *C23C 28/028* (2013.01); *C23C 28/321* (2013.01); *C23C 28/345* (2013.01); *C23C 30/00* (2013.01); *C23C 30/005* (2013.01); *C25D 3/12* (2013.01); *H01J 37/32477* (2013.01); *C22C 38/44* (2013.01); *C23C 16/4404* (2013.01); *C23C 18/1824* (2013.01); *Y10T 428/1259* (2015.01); *Y10T 428/12597* (2015.01); *Y10T 428/12604* (2015.01); *Y10T 428/12611* (2015.01); *Y10T 428/12618* (2015.01); *Y10T 428/1266* (2015.01); *Y10T 428/12667* (2015.01); *Y10T 428/12743* (2015.01); *Y10T 428/1275* (2015.01); *Y10T 428/12882* (2015.01); *Y10T 428/12889* (2015.01); *Y10T 428/12931* (2015.01); *Y10T 428/12937* (2015.01); *Y10T 428/12944* (2015.01); *Y10T 428/12951* (2015.01); *Y10T 428/12972* (2015.01); *Y10T 428/12979* (2015.01); *Y10T 428/12993* (2015.01); *Y10T 428/24942* (2015.01); *Y10T 428/2495* (2015.01); *Y10T 428/24967* (2015.01); *Y10T 428/24975* (2015.01); *Y10T 428/249953* (2015.04); *Y10T 428/26* (2015.01); *Y10T 428/265* (2015.01)

(58) Field of Classification Search
CPC ......... C23C 18/44; C23C 18/52; C23C 18/54; C23C 18/1637; C23C 18/1653; C23C 18/1689; C23C 18/1696; C23C 18/1848; C23C 18/32; C23C 18/1824; C23C 28/021; C23C 28/023; C23C 28/028; C23C 28/321; C23C 28/345; C23C 28/322; C23C 28/02; C23C 30/00; C23C 30/005; C25D 3/12; B32B 15/01; B32B 15/015; B32B 15/018; B32B 15/04; B32B 15/043; B32B 15/18; B32B 15/20; B32B 15/017; B32B 3/10; B32B 3/266; B32B 3/30; H01J 37/32477; C22C 38/44; Y10T 428/265; Y10T 428/26; Y10T 428/249953; Y10T 428/24942; Y10T 428/2495; Y10T 428/24967; Y10T 428/24975; Y10T 428/1259; Y10T 428/12597; Y10T 428/12604; Y10T 428/12611; Y10T 428/12618; Y10T 428/1266; Y10T 428/12667; Y10T 428/12889; Y10T 428/12944; Y10T 428/12931; Y10T 428/12882; Y10T 428/12937; Y10T 428/12979; Y10T 428/1275; Y10T 428/12743; Y10T 428/12951; Y10T 428/12972; Y10T 428/12993
See application file for complete search history.

(56) References Cited

U.S. PATENT DOCUMENTS

| | | | |
|---|---|---|---|
| 6,627,329 | B1 | 9/2003 | Shintani |
| 7,390,354 | B2 | 6/2008 | Aiba et al. |
| 10,847,830 | B2 | 11/2020 | Tsuruda et al. |
| 2003/0022017 | A1 | 1/2003 | Minamikawa |
| 2005/0196634 | A1 | 9/2005 | Abe et al. |
| 2006/0269761 | A1 | 11/2006 | Aiba et al. |
| 2012/0285720 | A1 | 11/2012 | Chou |
| 2013/0240256 | A1 | 9/2013 | Von Werne |
| 2016/0265114 | A1* | 9/2016 | Mukai ............... C23C 18/1633 |
| 2018/0198152 | A1 | 7/2018 | Tsuruda et al. |
| 2022/0228266 | A1* | 7/2022 | Furuya ............... C23C 18/1696 |

FOREIGN PATENT DOCUMENTS

| | | | |
|---|---|---|---|
| CN | 1956632 | A | 5/2007 |
| CN | 101275224 | A | 10/2008 |
| CN | 101578393 | A | 11/2009 |
| CN | 102677114 | A | 9/2012 |
| CN | 102978671 | A | 3/2013 |
| CN | 103668369 | A | 3/2014 |
| CN | 107059074 | A | 8/2017 |
| CN | 108359966 | A | 8/2018 |
| CN | 109628913 | A | 4/2019 |
| CN | 109891004 | A | 6/2019 |
| EP | 0 446 079 | A1 | 9/1991 |
| EP | 0 446 079 | B1 | 7/1995 |
| JP | 5-311490 | A | 11/1993 |
| JP | 7-258887 | A | 10/1995 |
| JP | 7-258889 | A | 10/1995 |
| JP | 2954716 | B2 | 9/1999 |
| JP | 2000-15743 | A | 1/2000 |
| JP | 2000-277644 | A | 10/2000 |
| JP | 3094000 | B2 | 10/2000 |
| JP | 2001-234360 | A | 8/2001 |
| JP | 2003-13248 | A | 1/2003 |
| JP | 2003-293147 | A | 10/2003 |
| JP | 2003293147 | A * | 10/2003 ........... C23C 28/023 |
| JP | 2004-360066 | A | 12/2004 |
| JP | 2005-89860 | A | 4/2005 |
| JP | 2006-312763 | A | 11/2006 |
| JP | 2008-260646 | A | 10/2008 |
| JP | 2009-57596 | A | 3/2009 |
| JP | 2010-37603 | A | 2/2010 |

(56) References Cited

FOREIGN PATENT DOCUMENTS

| JP | 2016-160504 A | 9/2016 |
|---|---|---|
| JP | 2017-21956 A | 1/2017 |
| JP | 2017-128791 A | 7/2017 |

OTHER PUBLICATIONS

International Search Report dated Sep. 8, 2020, issued by the International Searching Authority in application No. PCT/JP2020/026840.

Written Opinion dated Sep. 8, 2020, issued by the International Searching Authority in application No. PCT/JP2020/026840.

* cited by examiner

LAMINATE

CROSS REFERENCE TO RELATED APPLICATIONS

This application is a National Stage of International Application No. PCT/JP2020/026840 filed Jul. 9, 2020, claiming priority based on Japanese Patent Application No. 2019-141027 filed Jul. 31, 2019.

TECHNICAL FIELD

The present invention relates to a laminate and a method for producing the same. More specifically, the present invention relates to a laminate suitable as a constituent member of devices such as semiconductor production devices, and a method for producing the laminate.

BACKGROUND ART

In a semiconductor production process, special halogen gases which are strongly reactive and corrosive such as fluorine, hydrogen chloride, boron trichloride, nitrogen trifluoride, chlorine trifluoride, and hydrogen bromide (these may be hereinafter referred to as "corrosive gas"), have conventionally been used in a dry etching step and in the cleaning of production devices for example.

However, when the above corrosive gas reacts with the moisture contained in an atmosphere and is hydrolyzed, products such as hydrogen fluoride, oxalic acid, and hydrogen chloride are generated. The products are problematic since they easily corrode metallic surfaces of constituent members such as valves, couplings, piping, and reaction chambers during the use of the corrosive gas.

In order to increase corrosion resistance, methods of plating a metallic base material with a nickel-phosphorus alloy to form a fluorinated passive film of nickel have conventionally been performed (see for example Patent Literature 1 to Patent Literature 3). However, such methods were insufficient in some cases.

In addition, for cleaning with the corrosive gas, the corrosive gas is introduced after the cooling of piping, causing a loss of time in the production line. For this reason, the development of new metallic materials for constituent members such as piping, which enable transition to a cleaning step without cooling and maintain corrosion resistance even at high temperatures, has been demanded.

In addition, the development of an ALD (Atomic Layer Deposition) process is in progress recently; the ALD process is a new process for semiconductor production which has been developed from a CVD process, which enables the formation of a film having a highly precisely controlled thickness on a deep drawing part with a high aspect ratio. Currently, $H_2O$ is mainly used in the ALD process. Due to a temperature range of approximately 150° C. to 400° C. during film formation, $H_2O$ naturally changes into high temperature steam. For this reason, further increased corrosion resistance has been demanded for constituent members of semiconductor production devices. As a method for preventing corrosion in a high temperature steam atmosphere, Hastelloy C®, for example, is used in the ALD) process, which however involves problems such as high price and difficulty in working in some cases.

Further, pinholes on a plating surface may be a reason for accelerating corrosion. There seem to be several factors in causing pinholes, for example, such that $H_2$ generated by a plating reaction forms bubbles during the formation of a plating film to inhibit film formation, or such that impurities (such as oxide film, contamination, and oil) remaining on a base material are not eliminated in a pretreatment step, resulting in the inhibition of film formation. In response to the above, Patent Literature 4 discloses an approach in which a metallic base material is plated with gold and is heated in an oxidative atmosphere to cover pinholes with an oxide film.

CITATION LIST

Patent Literature

Patent Literature 1: JP 2954716 B2
Patent Literature 2: JP 3094000 B2
Patent Literature 3: JP 2004-360066 A
Patent Literature 4: JP 2008-260646 A

SUMMARY OF INVENTION

Technical Problem

As a result of a study by the present inventors, the methods of forming a fluorinated passive film of nickel on a nickel-phosphorus alloy plating surface as disclosed in Patent Literature 3 to Patent Literature 3 were found to involve insufficiency of steam corrosion resistance in some cases. With respect to the method disclosed in Patent Literature 4, an oxide film thereby formed may easily disappear depending on the environment due to the ultra-thin film thickness thereof. For this reason, the member as such involves a problem of difficult application as a practical member.

In view of the above, the object of the present invention is to provide a metallic material which is applicable to a constituent member of a semiconductor production device and excels in corrosion resistance, particularly corrosion resistance to acids or high temperature steam.

Solution to Problem

The present invention relates to the following [1] to [12] for example.

[1] A laminate comprising a metallic base material, a nickel-containing plating film layer formed on the metallic base material, and a gold plating film layer formed on the nickel-containing plating film layer, in which pinholes in the gold plating film layer are sealed with a passive film having a thickness of 15 nm or greater.

[2] The laminate described in [1], in which the metallic base material comprises at least a metal selected from the group consisting of stainless steel, iron, aluminum, aluminum alloys, copper, and copper alloys.

[3] The laminate described in [1] or [2], having a nickel strike layer between the metallic base material and the nickel-containing plating film layer.

[4] The laminate described in any one of [1] to [3], in which the nickel-containing plating film layer comprises a nickel-phosphorus alloy plating layer (1) having a phosphorus concentration of 8% by mass or higher and lower than 10% by mass, and a nickel-phosphorus alloy plating layer (2) having a phosphorus concentration of 10% by mass or higher and 12% by mass or lower in this order from the metallic base material.

[5] The laminate described in any one of [1] to [4], in which the gold plating film layer comprises a displacement gold plating film layer and a reduction gold plating film layer in this order from the nickel-containing plating film layer.

[6] A constituent member of a semiconductor production device, made up of the laminate described in any one of [1] to [5].

[7] A method for producing a laminate, comprising a step (A) of forming a nickel-containing plating film layer on a metallic base material, a step (B) of forming a gold plating film layer on the nickel-containing plating film layer, and a sealing treatment step (C) of forming a passive film having a thickness of 15 nm or greater on pinholes in the gold plating film layer.

[8] The method for producing a laminate described in [7], in which the sealing treatment step (C) is performed in an atmosphere in which an oxygen gas concentration is 50% by volume or higher and a temperature is 140° C. to 200° C.

[9] The method for producing a laminate described in [7] or [8], in which the metallic base material comprises at least a metal selected from the group consisting of stainless steel, iron, aluminum, aluminum alloys, copper, and copper alloys.

[10] The method for producing a laminate described in any one of [7] to [9], comprising a step of subjecting the metallic base material to a nickel strike treatment under the condition of a current density of 5 to 20 A/dm$^2$ before the step (A).

[11] The method for producing a laminate described in any one of [7] to [10], in which the step (A) comprises a step (a1) of forming the nickel-phosphorus alloy plating layer (1) having a phosphorus concentration of 8% by mass or higher and lower than 10% by mass, and a step (a2) of forming the nickel-phosphorus alloy plating layer (2) having a phosphorus concentration of 10% by mass or higher and 12% by mass or lower after the step (a1).

[12] The method for producing a laminate described in any one of [7] to [11], in which the step (B) comprises a step (b1) of forming a displacement gold plating film layer, and a step (b2) of forming a reduction gold plating film layer after the step (b1).

Advantageous Effects of Invention

The present invention is capable of providing laminates having excellent corrosion resistance, particularly excellent corrosion resistance to acids or high temperature steam.

DESCRIPTION OF EMBODIMENTS

Figure 1A:
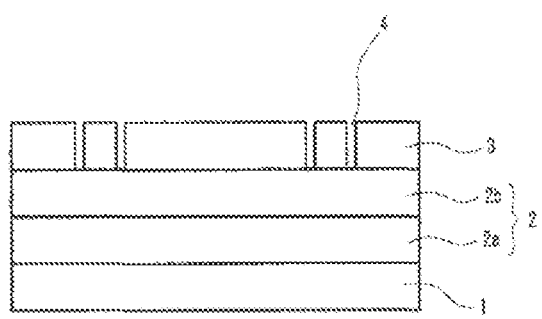
FIG. 1A is a schematic drawing showing a laminate before sealing treatment and FIG. 1B is a schematic drawing showing a laminate after sealing treatment.
Figure 1B:
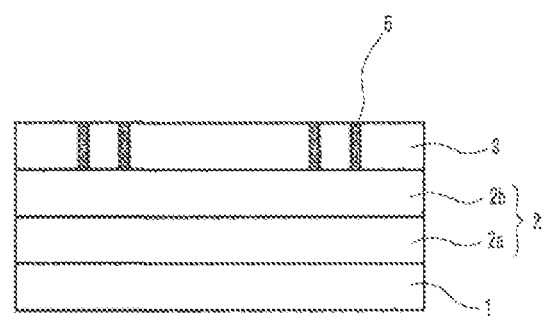

An embodiment of the present invention is specifically described below.

A laminate of an embodiment of the present invention comprises a metallic base material, a nickel-containing plating film layer formed on the metallic base material, and a gold plating film layer formed on the nickel-containing plating film layer, in which pinholes in the gold plating film layer are sealed with a passive film having a thickness of 15 nm or greater.

A method for producing a laminate of an embodiment of the present invention comprises a step (A) of forming a nickel-containing plating film layer on a metallic base material, a step (B) of forming a gold plating film layer on the nickel-containing plating film layer, and a sealing treatment step (C) of forming a passive film having a thickness of 15 nm or greater on pinholes in the gold plating film layer.

[Metallic Base Material]

Metallic base material used in an embodiment of the present invention have at least a surface made up of a metal. The metallic base materials are not particularly limited, and examples thereof are metals generally used in constituent members of semiconductor production devices, preferably including stainless steel, iron, aluminum, aluminum alloys, copper, and copper alloys.

In order to increase adhesion to a nickel-containing plating film layer, the metallic base materials may be subjected to a pretreatment in the step (A) such as a degreasing treatment, an acid cleaning treatment, or a nickel strike treatment depending on the base materials. The nickel strike treatment is a preliminary plating treatment using a nickel-containing plating bath, in which a current density is preferably 5 to 20 A/dm$^2$, and more preferably 6 to 10 A/dm$^2$. The duration of the nickel strike treatment is preferably 5 seconds or longer and 5 minutes or shorter.

[Nickel-Containing Plating Film Layer]

A nickel-containing plating film layer is formed on the metallic base material by the step (A). When the metallic base material is subjected to a nickel strike treatment, a nickel strike layer is formed between the metallic base material and the nickel-containing plating film layer.

From the viewpoint of increased corrosion resistance, the nickel-containing plating film layer preferably contains phosphorus, and more preferably contains a nickel-phosphorus alloy plating layer (1) having a phosphorus concentration of 8% by mass or greater and lower than 10% by mass, and a nickel-phosphorus alloy plating layer (2) having a phosphorus concentration of 10% by mass or greater and 12% by mass or lower in this order from the metallic base material.

The nickel-containing plating film layer has a nickel content of preferably 80% by mass or higher, more preferably 85% to 95% by mass, and particularly preferably 88% to 92% by mass in relation to 100% by mass of the entirety of the nickel-containing plating film layer. Due to a nickel content within the above range, the proportion of phosphorus in the film layer increases, which exhibits excellent corrosion resistance. In addition, when electroless nickel-phosphorus alloy plating films having different phosphorus concentrations are laminated, film formation proceeds while forming pinhole defects in different positions. For this reason, disturbance hardly reaches the base material directly, and increased corrosion resistance is anticipated.

<Step (A)>

The nickel-containing plating film layer may be formed on a metallic base material using an electroless plating bath comprising a nickel salt and a phosphorus compound as a reducer. Examples of nickel salts are nickel sulfate, nickel, chloride, nickel acetate, and nickel carbonate. Examples of phosphorus compounds are sodium hypophosphite and potassium hypophosphite.

The step (A) preferably comprises a step (a1) of forming the nickel-phosphorus alloy plating layer (1), and a step (a2) of forming the nickel-phosphorus alloy plating layer (2) after the step (a1).

The film formation rate of the nickel-phosphorus alloy plating layer (1) is preferably 20 to 30 µm/h (hour), more preferably 22 to 25 µm/h (hour), and the film formation rate of the nickel-phosphorus allay plating layer (2) is preferably 10 to 15 µm/h (hour), more preferably 11 to 13 µm/h (hour). The thus-formed nickel-phosphorus allay plating layers (1) and (2) are capable of increasing corrosion resistance. The nickel-phosphorus alloy plating layers (1) and (2) each have a film thickness of preferably 5 μm or greater, and more preferably 7 to 25 μm. From the viewpoints of film properties of resisting pinhole formation and cost efficiency, the thickness is still more preferably from 10 to 20 μm.

[Gold Plating Film Layer]

The gold plating film layer is formed on the nickel-containing plating film layer by the step (B).

The gold content in a gold plating film is, relative to 100% by mass of the entirety of the gold platina film layer, preferably 90% by mass or greater, more preferably 99% by mass or greater, and particularly preferably 99.9% by mass or greater. Due to the gold content within the above range, corrosion resistance of a laminate according to the present invention is stabilized. The gold content is obtainable by a method for quantifying impurities, namely by dissolving gold plating in aqua regia to measure the gold content by atomic absorption spectrometry and inductively coupled plasma (ICP) atomic emission spectroscopy.

From the viewpoints of film properties of resisting pinhole formation and cost efficiency, the thickness of the gold plating film is preferably from 0.1 μm to 1 μm, more preferably 0.2 μm to 0.9 μm, and still more preferably 0.3 μm to 0.8 μm. It is publicly known based on conventional art that the thicker the precious metal plating film is, the more the number of pinholes is reduced. High corrosion resistance is expected to be achievable by increasing the thickness of a precious metal plating film, which is, however, practically unpreferable due to the high price thereof.

<Step (B)>

Methods for forming the gold plating film layer are not particularly limited and an electroless gold platina method is preferred. In an electroless gold plating method, it is preferred to perform displacement gold plating and thereafter reduction gold plating. Namely, the step (B) preferably comprises a step (b1) of forming a displacement gold plating film layer, and a step (b2) if forming a reduction gold plating film layer after the step (b1).

In displacement gold plating, nickel is dissolved from a nickel film releasing electrons, which reduce gold ions in the solution, and the reduced gold ions in the solution are deposited as a gold plating film. In reduction gold plating, gold ions in the solution are reduced by electrons released due to an oxidation reaction by a reducer, and thereby a gold plating film is deposited.

Examples of electroless gold plating solutions are plating baths containing components such as gold potassium cyanide, gold chloride, gold sulfite, and gold thiosulfate. Examples of reducers are sodium hydroxide, dimethylamine borane, hexamethylenetetramine, and chain polyamines comprising an alkyl group having 3 or more carbon atom- and multiple amino groups.

The gold plating film layer is formed by performing displacement gold plating preferably at a temperature of 50° C. to 90° C. for 3 to 7 minutes, more preferably at a temperature of 65° C. to 75° C. for 3 to 7 minutes, and by performing reduction gold plating preferably at a temperature of 55° C. to 65° C. for 7 to 15 minutes, more preferably at a temperature of 58° C. to 62° C. for 7 to 15 minutes.

[Passive Film]

Pinholes in the gold plating film layer are sealed with a passive film by subjecting a surface of the gold plating film layer to an oxidation treatment in the step (C).

The thickness of the passive film is ordinarily 15 nm or greater, preferably 18 to 50 nm, more preferably 20 to 40 nm, and particularly preferably 25 to 35 nm. Due to the passive film thickness within the above range, the properties of the passive film such as durability become practically suitable.

<Step (C)>

In the step (C), a surface of the nickel-containing plating film layer exposed from pinholes in the gold plating film layer that have undergone the steps (A) and (B) is forcibly oxidized to form a passive film, which seals the pinholes.

The step (C) is performed in an atmosphere in which an oxygen gas concentration is preferably 50% by volume or greater, more preferably 20% to 100% by volume, and an oxidation temperature is preferably 140° C. to 200° C., more preferably 150° C. to 180° C. Examples of gases accompanying oxygen gas are inert gases such as nitrogen gas and argon gas. When the metallic base material is made up of stainless steel, oxidation is performed at a temperature of preferably 150° C. to 190° C., more preferably 155° C. to 175° C., and when the metallic base material is made up of an aluminum alloy, oxidation is performed at a temperature of preferably 140° C. to 160° C., more preferably 145° C. to 155° C. The film formation temperature within the above range allows well-balanced thermal diffusion between electroless nickel-alloy plating and gold plating.

Oxidation duration varies in accordance with the thickness of a passive film intended to be formed, and the amount of time required for exhibiting excellent corrosion resistance is preferably 20 to 100 hours, and more preferably 30 to 80 hours.

EXAMPLES

The present invention is more specifically described below with reference to, but not limited to, examples.

Example 1

<Step (A)>

A surface of stainless steel (SUS316L) was subjected to a pretreatment comprising degreasing, acid cleaning, and a nickel strike treatment. On the surface of the stainless steel having undergone the nickel strike treatment, an electroless nickel-phosphorus alloy plating film layer (1) having a phosphorus content of 8% to 10% by mass in the formed film was formed using an electroless nickel-phosphorus plating chemical ("NIMUDEN (trade name) NSX" produced by C. Uyemura & Co., Ltd.) under the conditions such that a plating temperature was 90° C. and a pH value was 4.5 to 4.9, at a film formation rate of 10 μm/25 minutes. Subsequently, an electroless nickel-phosphorus alloy plating film layer (2) having a phosphorus content of 10% to 12% by mass in the formed film was formed using an electroless nickel-phosphorus plating chemical ("NIMUDEN (trade name) HDX" produced by C. Uyemura & Co., Ltd.) at a film formation rate of 10 μm/50 minutes. Thereby nickel-containing plating film layers having a total thickness of 20 μm were formed on the stainless steel having undergone the nickel strike treatment.

<Step (B)>

Two types of electroless gold plating solutions "Flash Gold NC (displacement type)" and "Self Gold OTK-IT (reduction type)" (both produced by Okuno Pharmaceutical Co., Ltd.) were used in this order. On the nickel-containing plating film layers formed in the step (A), a treatment at a displacement plating temperature of 70° C. for 5 minutes and a treatment at a reduction plating temperature of 60° C. for 10 minutes were each performed in this order to form gold plating film layers having a total thickness of 0.6 μm.

<Step C>

The stainless steel having the nickel-containing plating film layers and the gold plating film layers formed in the steps (A) and (B), was placed inside an atmospheric pressure gas-phase flow reactor, and the temperature inside the reactor was increased to 165° C. Thereafter, the atmosphere was replaced by nitrogen gas, followed by the introduction of 100% by volume of oxygen gas to replace the nitrogen gas by oxygen gas. After the complete replacement, the state was maintained for 36 hours, and exposed parts, formed by pinholes during the gold plating, of the substrate electroless nickel-phosphorus film were forcibly oxidized to form a passive film. The obtained passive film was analyzed with W-SEM "JSM-IT200" (produced by JEOL Ltd). It was confirmed that the thickness of the passive film was 20 nm.

Example 2

A passive film was formed in the same manner as described in Example 1 except for changing the duration of the forcible oxidization using 100% by volume of oxygen gas in the step (C) described in Example 1 to 72 hours. The thickness of the obtained passive film was determined in the same manner as described in Example 1. It was confirmed that the film thickness was 30 nm.

Example 3

An aluminum alloy (A5052) was used instead of the stainless steel (SUS316L) in Example 1 and a pretreatment comprising degreasing, art activation treatment, acid cleaning, and a zinc replacement treatment was performed, and thereafter the steps (A) and (B) were performed in the same manner as described in Example 1. The activation treatment was performed using an acid mixture of ammonium acid fluoride and nitric acid as a treating agent at room temperature for 30 seconds. The acid cleaning was performed using nitric acid as a cleaning agent at room temperature for 25 seconds. The zinc replacement treatment was performed using a zincate bath as a treating agent at room temperature for 25 seconds. The acid cleaning and zinc replacement treatment were each performed twice under the above conditions.

In the step (C), a passive film was formed on the gold plating film in the same manner as described in Example 1 except for adjusting the forcible oxidation temperature to 150° C. The thickness of the obtained passive film was determined in the same manner as described in Example 1. It was confirmed that the film thickness was 20 nm.

Comparative Example 1

By performing only the step (A) described in Example 1, a nickel-containing plating film layer with a thickness of 20 μm was formed on a surface of stainless steel.

Comparative Example 2

After performing the steps (A) and (B) described in Example 1, the stainless steel having nickel-containing plating film layers and a gold plating film layer, was exposed to the atmosphere to form a natural oxide film. The thickness of the obtained natural oxide film was determined in the same manner as described in Example 1. It was confirmed that the film thickness was 7 nm.

Comparative Example 3

The treatment below was performed after performing the step (A) described in Example 1. The stainless steel having a nickel-containing plating film layer was placed inside the atmospheric pressure gas phase flow reactor, and the temperature inside the reactor was increased to 300° C. Thereafter, the atmosphere was replaced with nitrogen gas, followed by the introduction of 100% by volume of oxygen gas' to replace nitrogen gas with oxygen gas. After the complete replacement, the state was maintained for 12 hours. Subsequently, 10% by volume of $F_2$ gas was introduced and the state was maintained for 12 hours to form a nickel fluoride ($NiF_2$) film on the nickel-containing plating film layer. Thereafter, nitrogen gas was injected for 12 hours to stabilize film formation.

[Evaluation]

The films on the surfaces of the metallic base materials obtained in the above Examples 1 to 0.3 and the Comparative Examples 1 to 3 were evaluated by the method below. The evaluation results are summarized in Table 1.

<Hydrochloric Acid Corrosion Resistance Test>

A test piece in a size of 15 mm (length)×15 mm (width)×1 mm (thickness) was immersed in a 35% mass hydrochloric acid solution at a temperature of 25° C. for 5 hours. Based on the reduced amount of mass [$mg/dm^2$] before and after the immersion, hydrochloric acid corrosion resistance was evaluated in accordance with the following criteria.

(Evaluation Criteria.)

A: less than 0.1 $mg/dm^2$
B: 0.1 $mg/dm^2$ or greater and less than 3 $mg/dm^2$
C: 3 $mg/dm^2$ or greater <Steam Corrosion Resistance Test>

A test piece in a size of 15 mm (length)×15 mm (width)×1 mm (thickness) was left to stand in a saturated steam atmosphere at a temperature of 190° C. for 144 hours. Based on the reduced amount of mass [$mg/dm^2$] before and after the test, steam corrosion resistance was evaluated in accordance with the following criteria.

(Evaluation Criteria)

A: less than 0.1 $mg/dm^2$
B: 0.1 $mg/dm^2$ or greater and less than 3 $mg/dm^2$
C: 3 $mg/dm^2$ or greater

TABLE 1

|  | Example 1 | Example 2 | Example 3 | Comparative Example 1 | Comparative Example 2 | Comparative Example 3 |
|---|---|---|---|---|---|---|
| Metallic base material | SUS | SUS | AL | SUS | SUS | SUS |
| Nickel-containing plating film layer | Formed | Formed | Formed | Formed | Formed | Formed |
| Gold plating film layer | Formed | Formed | Formed | Not formed | Formed | Not formed |
| Sealing treatment | Performed | Performed | Performed | Not performed | Performed | Not performed |
| Thickness of passive film [nm] | 20 | 30 | 20 | — | 7 | — |
| $NiF_2$ treatment | Not performed | Not performed | Not performed | Not performed | Not performed | Performed |
| Hydrochloric acid corrosion resistance | B | A | B | C | C | C |
| Steam corrosion resistance | B | A | B | C | B | C |

In Table 1, SUS means stainless steel (SUS316L) and AL means an aluminum alloy (A5052).

REFERENCE SIGNS LIST

1 Metallic base material
2 Nickel-containing plating film layer
2*a* Nickel-phosphorus alloy plating layer (1)
2*b* Nickel-phosphorus alloy plating layer (2)
3 Gold plating film layer
4 Pinhole
5 Passive film

The invention claimed is:

1. A laminate comprising a metallic base material, a nickel-containing plating film layer formed on the metallic base material, and a gold plating film layer formed on the nickel-containing plating film layer,
   wherein pinholes in the gold plating film layer are sealed with a passive film having a thickness of 15 nm or greater,
   wherein the passive film is formed on a surface of the nickel-containing plating layer by forcible oxidation of the nickel-containing plating layer.

2. The laminate according to claim 1, wherein the metallic base material comprises at least a metal selected from the group consisting of stainless steel, iron, aluminum, aluminum alloys, copper, and copper alloys.

3. The laminate according to claim 1, having a nickel strike layer between the metallic base material and the nickel-containing plating film layer.

4. The laminate according to claim 1, wherein the nickel-containing plating film layer comprises a nickel-phosphorus alloy plating layer (1) having a phosphorus concentration of 8% by mass or higher and lower than 10% by mass, and a nickel-phosphorus alloy plating layer (2) having a phosphorus concentration of 10% by mass or higher and 12% by mass or lower in this order from the metallic base material.

5. The laminate according to claim 1, wherein the gold plating film layer comprises a displacement gold plating film layer and a reduction gold plating film layer in this order from the nickel-containing plating film layer.

6. A constituent member of a semiconductor production device, made up of the laminate according to claim 1.

* * * * *